US012069972B2

(12) United States Patent
Han

(10) Patent No.: US 12,069,972 B2
(45) Date of Patent: Aug. 20, 2024

(54) SEMICONDUCTOR DEVICE AND MANUFACTURING METHOD OF SEMICONDUCTOR DEVICE

(71) Applicant: SK hynix Inc., Icheon (KR)

(72) Inventor: Ji Sun Han, Icheon (KR)

(73) Assignee: SK hynix Inc., Icheon (KR)

( * ) Notice: Subject to any disclaimer, the term of this patent is extended or adjusted under 35 U.S.C. 154(b) by 266 days.

(21) Appl. No.: 17/391,858

(22) Filed: Aug. 2, 2021

(65) Prior Publication Data

US 2022/0263020 A1  Aug. 18, 2022

(30) Foreign Application Priority Data

Feb. 15, 2021 (KR) .................. 10-2021-0020127

(51) Int. Cl.
*H10N 70/00* (2023.01)
*H10B 63/00* (2023.01)
*H10N 70/20* (2023.01)

(52) U.S. Cl.
CPC ........... *H10N 70/841* (2023.02); *H10B 63/84* (2023.02); *H10N 70/026* (2023.02); *H10N 70/231* (2023.02); *H10N 70/821* (2023.02)

(58) Field of Classification Search
CPC .................................................. H10N 70/841
See application file for complete search history.

(56) References Cited

U.S. PATENT DOCUMENTS

| 9,287,498 | B2 | 3/2016 | Kau | |
| 9,299,929 | B2 | 3/2016 | Gotti et al. | |
| 10,079,340 | B2 * | 9/2018 | Chan | H10N 70/841 |
| 2015/0129998 | A1 * | 5/2015 | Mani | H10N 50/80 |
| | | | | 257/427 |
| 2019/0043924 | A1 * | 2/2019 | Conti | H10B 63/24 |
| 2019/0198756 | A1 * | 6/2019 | Zheng | H10B 63/20 |

* cited by examiner

*Primary Examiner* — Mounir S Amer

(57) ABSTRACT

A semiconductor device includes: a first electrode including a carbon layer; a second electrode; a variable resistance layer interposed between the first electrode and the second electrode; and a barrier layer interposed between the first electrode and the variable resistance layer, the barrier layer including nitrogen and carbon. A concentration of the nitrogen in the barrier layer is equal to or higher than that of the carbon in the barrier layer.

9 Claims, 7 Drawing Sheets

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2021-0020127 filed on Feb. 15, 2021, in the Korean Intellectual Property Office, the entire disclosure of which is incorporated by reference herein.

BACKGROUND

1. Technical Field

The present disclosure generally relates to an electronic device, and more particularly, to a semiconductor device and a manufacturing method of a semiconductor device.

2. Related Art

A degree of integration of a semiconductor device is mainly determined by an area occupied by a unit memory cell. As the improvement of the degree of integration of semiconductor devices in which memory cells are formed in the form of a single layer over a substrate reaches the limit, there has recently been proposed a three-dimensional semiconductor device in which memory cells are stacked over a substrate. Various structures and manufacturing methods have been developed so as to improve the operational reliability of the three-dimensional semiconductor device.

SUMMARY

Embodiments relate to a semiconductor device having a stable structure and improved characteristics, and a manufacturing method of the semiconductor device.

In accordance with an aspect of the present disclosure, there is provided a semiconductor device including: a first electrode including a carbon layer; a second electrode; a variable resistance layer interposed between the first electrode and the second electrode; and a barrier layer interposed between the first electrode and the variable resistance layer, the barrier layer including nitrogen and carbon, wherein a concentration of the nitrogen in the barrier layer is equal to or higher than that of the carbon in the barrier layer.

In accordance with another aspect of the present disclosure, there is provided a method of manufacturing a semiconductor device, the method including: forming a first electrode including a carbon layer; forming, on the first electrode, a barrier layer including carbon nitride in which a concentration of nitrogen is equal to or higher than that of carbon; forming a variable resistance layer on the barrier layer; and forming a second electrode on the variable resistance layer.

In accordance with an aspect of the present disclosure, there is provided a semiconductor device including: a first electrode including a first element; a second electrode; a variable resistance layer interposed between the first electrode and the second electrode; and a barrier layer interposed between the first electrode and the variable resistance layer, the barrier layer including the first element and a second element, wherein a concentration of the second element in the barrier layer is equal to or higher than that of the first element in the barrier layer, and the barrier layer is in an amorphous state.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. These embodiments according to the concept of the present disclosure can be implemented in various forms, and cannot be construed as being limited to the embodiments set forth herein.

Figure 1:
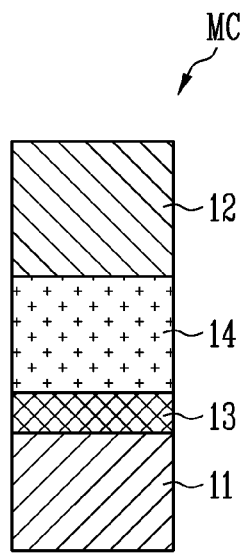
FIG. 1 is a view illustrating a structure of a semiconductor device in accordance with an embodiment of the present disclosure.

FIG. 1 is a view illustrating a structure of a semiconductor device in accordance with an embodiment of the present disclosure.

Referring to FIG. 1, the semiconductor device in accordance with the embodiment of the present disclosure may include a first electrode 11, a second electrode 12, a barrier layer 13, and a variable resistance layer 14. The semiconductor device may include a memory cell MC, and the first electrode 11, the second electrode 12, the barrier layer 13, and the variable resistance layer 14 may constitute the memory cell MC.

The first electrode 11 may be a portion of a word line or a bit line, or be electrically connected to the word line or the bit line. The first electrode 11 may include a conductive material such as poly-silicon or metal. In an embodiment, the first electrode 11 may include poly-silicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride (CNx) silicon carbide (SiC), silicon carbon nitride (SiCN), copper (Cu), zinc (Zn), nickel (Ni), cobalt (Co), lead (Pd), platinum (Pt), molybdenum (Mo), ruthenium (Ru), or the like, or include a combination thereof.

The second electrode 12 may be a portion of a bit line or a word line, or be electrically connected to the bit line or the word line. When the first electrode 11 is electrically connected to the word line, the second electrode 12 may be electrically connected to the bit line. The first electrode 11 may include a conductive material such as poly-silicon or metal. In an embodiment, the second electrode 12 may include poly-silicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride (CNx) silicon carbide (SiC), silicon carbon nitride (SiCN), copper (Cu), zinc (Zn), nickel (Ni), cobalt (Co), lead (Pd), platinum (Pt), molybdenum (Mo), ruthenium (Ru), or the like, or include a combination thereof. In an embodiment, the second electrode 12 may include a carbon layer.

The variable resistance layer 14 may be located between the first electrode 11 and the second electrode 12. The variable resistance layer 14 may include a resistive material, and have a characteristic of reversibly changing between different resistance states according to an applied voltage or current.

In an embodiment, the variable resistance layer 14 may include a transition metal oxide or include a metal oxide such as a perovskite-based material. Thus, an electrical path is generated or eliminated in the variable resistance layer 14, so that data can be stored in the memory cell.

In an embodiment, the variable resistance layer 14 may have an MTJ (Magnetic Tunnel Junction) structure, and include a magnetization fixed layer, a magnetization free layer, and a tunnel barrier layer interposed therebetween. For example, the magnetization fixed layer and the magnetization free layer may include a magnetic material, and the tunnel barrier layer may include oxide such as magnesium (Mg), aluminum (Al), zinc (Zn), or titanium (Ti). The magnetization direction of the magnetization free layer may be changed by spin torque of electrons in an applied current. Therefore, data may be stored in the memory cell according to a change in the magnetization direction of the magnetization free layer with respect to the magnetization direction of the magnetization fixed layer.

In an embodiment, the variable resistance layer 14 may include a phase change material, and include chalcogenide-based material. The variable resistance layer 14 may include chalcogenide glass, a chalcogenide alloy, etc. The variable resistance layer 14 may include silicon (Si), germanium (Ge), antimony (Sb), tellurium (Te), bismuth (Bi), indium (In), tin (Sn), selenium (Se), or the like, or include a combination thereof. In an embodiment, the variable resistance layer 14 may be Ge—Sb—Te (GST), and be $Ge_2Sb_2Te_5$, $Ge_2Sb_2Te_7$, $Ge_1Sb_2Te_4$, $Ge_1Sb_4Te_7$, or the like. The variable resistance layer 14 may be phase-changed depending on a program operation. In an embodiment, the variable resistance layer 14 may have a low-resistance crystalline state due to a set operation. In an embodiment, the variable resistance layer 14 may have a high-resistance amorphous state due to a reset operation. Therefore, data may be stored in the memory cell by using a resistance difference caused by a phase change of the variable resistance layer 14.

In an embodiment, the variable resistance layer 14 may include a variable resistance material of which resistance is changed without any phase change, and include a chalcogenide-based material. The variable resistance layer 14 may include germanium (Ge), antimony (Sb), tellurium (Te), arsenic (As), selenium (Se), silicon (Si), indium (In), tin (Sn), sulfur (S), gallium (Ga), or the like, or include a combination thereof. The variable resistance layer 14 may include a chalcogenide-based material which maintains an amorphous state in a program operation. The variable resistance layer 14 has an amorphous state, and may not be changed to a crystalline state in the program operation. Therefore, the threshold voltage of the memory cell may be changed according to a program voltage applied to the memory cell, and the memory cell may be programmed to at least two states. In an embodiment, when a negative program voltage is applied to the memory cell, the memory cell may have a relatively high threshold voltage. In an embodiment, when a positive program voltage is applied to the memory cell, the memory cell may have a relatively low threshold voltage. Therefore, data may be stored in the memory cell by using a threshold voltage difference of the memory cell.

The barrier layer 13 may be interposed between the first electrode 11 and the variable resistance layer 14, or between the second electrode 12 and the variable resistance layer 14, or both. The barrier layer 13 may have an amorphous state. For example, the barrier layer 13 may include one or more elements (e.g., carbon) included in the first electrode 11, or the second electrode 12, or both. The barrier layer 13 may include nitrogen and carbon. In an embodiment, the barrier layer 13 may include carbon nitride. The barrier layer 13 may include CxNy, and x and y may be integers of 1 or more. In the barrier layer 13, a concentration of the nitrogen may be equal to that of the carbon or be higher than that of the carbon. When the concentration of the nitrogen increases, specific resistance may increase. The barrier layer 13 may be a non-conductor in which current does not flow or hardly flows. In an embodiment, the barrier layer 13 may include $C_3N_4$.

The barrier layer 13 may have a relatively small volume as compared with the first electrode 11. The barrier layer 13 may be formed with a relatively thin thickness on a surface of the first electrode 11. In an embodiment, the volume of the barrier layer 13 may be 1% to 10% of that of the first electrode 11. In an embodiment, the thickness of the barrier layer 13 may be 1 Å to 10 Å. When the volume or thickness of the barrier layer 13 is relatively large, a firing voltage for activating the memory cell increases, and hence the variable resistance layer 14 may be damaged. Also, when the volume or thickness of the barrier layer 13 is relatively large, current may not flow. For example, when the volume of the barrier layer 13 exceeds 10% of the volume of the first electrode 11, the firing voltage for activating the memory cell may become excessively high to damage the variable resistance layer 14 and a current may not flow through the barrier layer 13 even when a program voltage is applied to the memory cell. When the volume of the barrier layer 13 is less than 1% of the volume of the first electrode 11, the barrier layer 13 may not sufficiently increase a read window margin of the memory cell MC. Thus, in accordance with the embodiment of the present disclosure, the barrier layer 13 is formed to have a small volume or thickness as compared with the first electrode 11, so that the damage of the variable resistance layer 14 can be substantially prevented. Further, current can flow through the barrier layer 13 in the program operation.

According to the structure described above, the first electrode 11, the second electrode 12, the barrier layer 13, and the variable resistance layer 14 may constitute the memory cell MC. In an embodiment, the memory cell MC may serve as a selection element while being a memory element. Alternatively, the memory cell MC may separately include a selection element or a memory element. Also, the memory cell MC includes the barrier layer 13, so that a read window margin of the memory cell MC can be increased.

Figure 2:
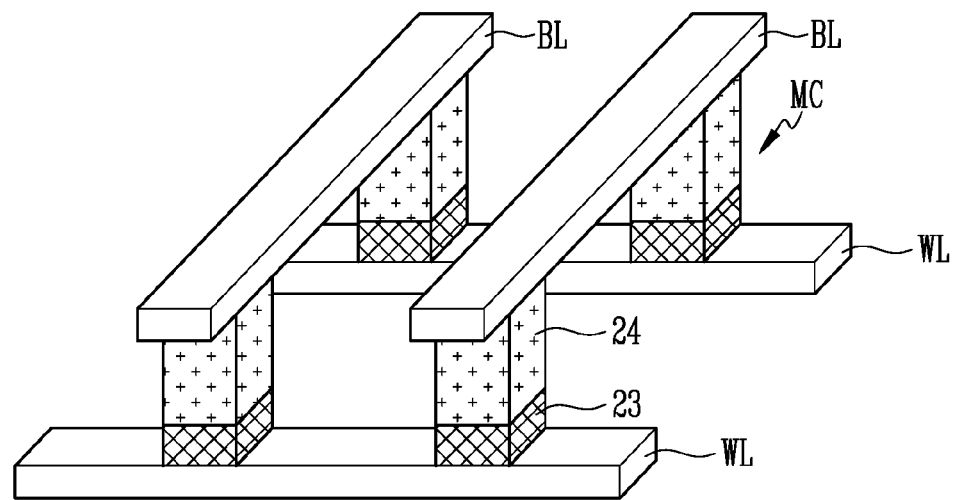
FIG. 2 is a view illustrating a structure of a semiconductor device in accordance with an embodiment of the present disclosure.
Figure 2:
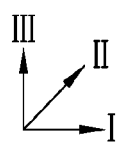

FIG. 2 is a view illustrating a structure of a semiconductor device in accordance with an embodiment of the present disclosure.

Referring to FIG. 2, the semiconductor device may include word lines WL, bit lines BL, and memory cells MC. The word lines WL may extend in a first direction I. The bit lines BL may extend in a second direction II intersecting the first direction I.

The memory cells MC may be located in intersection regions of the word lines WL and the bit lines BL. In an embodiment, each of the memory cells MC may include a barrier layer 23 and a variable resistance layer 24. The barrier layer 23 may be located between the word line WL and the variable resistance layer 24, or be located between the bit line BL and the variable resistance layer 24, or both. The variable resistance layer 24 and the barrier layer 23 may be stacked in a third direction III. The third direction III may be a direction protruding from a plane defined by the first direction I and the second direction II, and protrude vertically from the plane.

The memory cells MC may further include a first electrode interposed between the word line WL and the barrier layer 23, or include a second electrode interposed between the bit line BL and the variable resistance layer 24, or both. Alternatively, a portion of the word line WL may be the first electrode, or a portion of the bit line BL may be the second electrode.

Meanwhile, although FIG. 2 illustrates a structure in which the memory cells MC are arranged in the first direction I and the second direction II, the memory cells MC may be stacked in the third direction III. The bit lines BL and the word lines WL may be alternately stacked, and the memory cells MC may be located between the bit lines BL and the word lines WL, which are stacked.

Figure 3A:
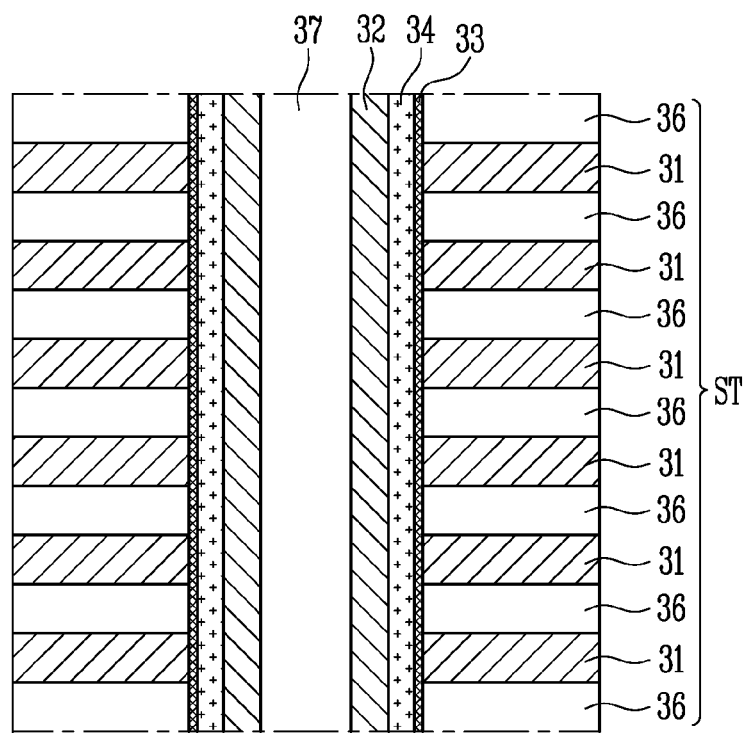
FIGS. 3A and 3B are views each illustrating a structure of a semiconductor device in accordance with an embodiment of the present disclosure.
Figure 3B:
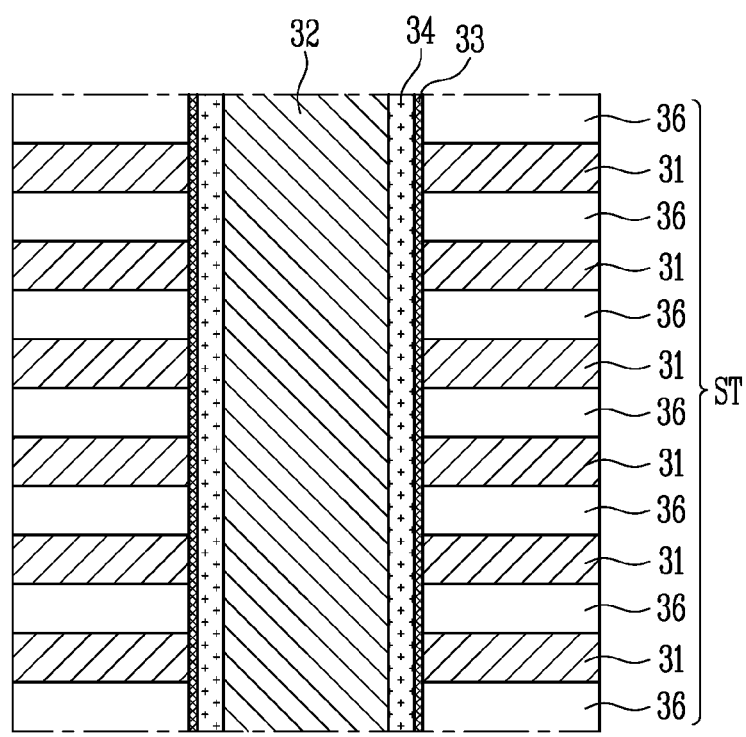

FIGS. 3A and 3B are views each illustrating a structure of a semiconductor device in accordance with an embodiment of the present disclosure. Hereinafter, descriptions of portions overlapping with those described above may be omitted for the interest of brevity.

Referring to FIGS. 3A and 3B, the semiconductor device may include a stack structure ST, a barrier layer 33, a variable resistance layer 34, and a second conductive layer 32. The semiconductor device may further include a gap fill layer 37.

The stack structure ST may include first conductive layers 31 and insulating layers 36, which are alternately stacked. The first conductive layers 31 may include a conductive material such as poly-silicon or metal. In an embodiment, the first conductive layers 31 may include poly-silicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride (CNx) silicon carbide (SiC), silicon carbon nitride (SiCN), copper (Cu), zinc (Zn), nickel (Ni), cobalt (Co), lead (Pd), platinum (Pt), molybdenum (Mo), ruthenium (Ru), or the like, or include a combination thereof. In an embodiment, the first conductive layers 31 may include a carbon layer. The first conductive layers 31 may be word lines or bit lines. The insulating layers 36 are used to insulate the first conductive layers 31 from each other, and may include an insulating material such as oxide or nitride.

The second conductive layer 32 may penetrate the stack structure ST. Referring to FIG. 3A, the second conductive layer 32 may have a structure of which a central region is opened. The gap fill layer 37 may be filled in the second conductive layer 32. Referring to FIG. 3B, the second conductive layer 32 may have a structure in which the second conductive layer 32 is filled up to the central region thereof. The gap fill layer 37 may not be formed in the second conductive layer 32.

The second conductive layer 32 may include poly-silicon, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), carbon nitride (CNx) silicon carbide (SiC), silicon carbon nitride (SiCN), copper (Cu), zinc (Zn), nickel (Ni), cobalt (Co), lead (Pd), platinum (Pt), molybdenum (Mo), ruthenium (Ru), or the like, or include a combination thereof. In an embodiment, the second conductive layer 32 may include a carbon layer. The second conductive layer 32 may be a bit line or a word line. When the first conductive layers 31 are word lines, the second conductive layer 32 may be a bit line.

The variable resistance layer 34 may be interposed between the first conductive layers 31 and the second conductive layer 32. In an embodiment, the variable resistance layer 34 may be formed to surround a sidewall of the second conductive layer 32.

The barrier layer 33 may be interposed between the variable resistance layer 34 and the first conductive layers 31, or between the variable resistance layer 34 and the second conductive layer 32, or both. In an embodiment, the barrier layer 33 may be formed to surround a sidewall of the variable resistance layer 34.

According to the structure described above, memory cells may be located in intersection regions of the first conductive layers 31 and the second conductive layer 32. The stacked memory cells may share the barrier layer 33, the variable resistance layer 34, and the second conductive layer 32.

Figure 4:
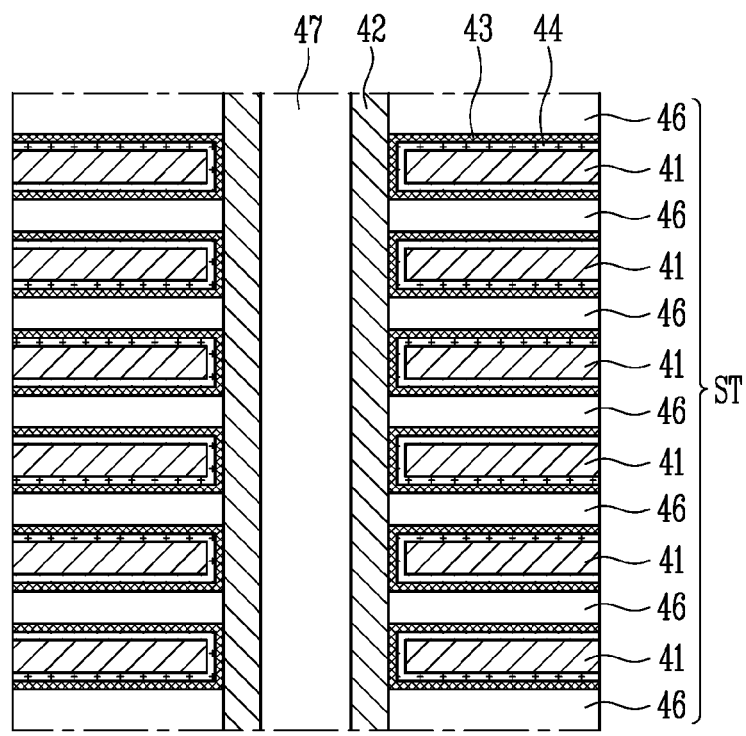
FIG. 4 is a view illustrating a structure of a semiconductor device in accordance with an embodiment of the present disclosure.

FIG. 4 is a view illustrating a structure of a semiconductor device in accordance with an embodiment of the present disclosure. Hereinafter, descriptions of portions overlapping with those described above may be omitted for the interest of brevity.

Referring to FIG. 4, the semiconductor device may include a stack structure ST, barrier layers 43, variable resistance layers 44, and a second conductive layer 42. The semiconductor device may further include a gap fill layer 47.

The stack structure ST may include first conductive layers 41 and insulating layers 46. The second conductive layer 42 may penetrate the stack structure ST. The second conductive layer 42 may have a structure of which a central region is opened, or have a structure in which the second conductive layer 42 is filled up to the central region thereof.

Each of the barrier layers 43 may be interposed between the first conductive layers 41 and the second conductive layer 42, and extend between the insulating layers 46 and the first conductive layer 41. The barrier layers 43 may respectively surround the variable resistance layers 44. Each of the barrier layers 43 may have a C-shaped section.

Each of the variable resistance layers 44 may be interposed between the first conductive layers 41 and the second conductive layer 42, and extend between the insulating layers 46 and the first conductive layers 41. The variable resistance layers 44 may be respectively interposed between the barrier layers 43 and the first conductive layers 41. The variable resistance layers 44 may respectively surround the first conductive layers 41. Each of the variable resistance layers 44 may have a C-shaped section.

According to the structure described above, memory cells may be located in intersection regions of the first conductive layers 41 and the second conductive layer 42. The barrier layers 43 and the variable resistance layers 44 of the stacked memory cells may be isolated from each other. The stacked memory cells may share the second conductive layer 42.

Figure 5A:
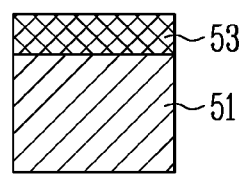
FIGS. 5A and 5B are views illustrating a manufacturing method of a semiconductor device in accordance with an embodiment of the present disclosure.
Figure 5B:
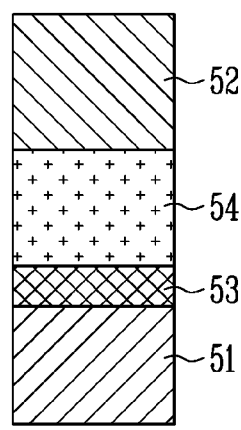

FIGS. 5A and 5B are views illustrating a manufacturing method of a semiconductor device in accordance with an embodiment of the present disclosure. Hereinafter, descriptions of portions overlapping with those described above may be omitted for the interest of brevity.

Referring to FIG. 5A, a first electrode 51 is formed. In an embodiment, the first electrode 51 may include a carbon layer. Subsequently, a barrier layer 53 is formed on the first electrode 51. The barrier layer 53 may include nitrogen and carbon. The barrier layer 53 may include carbon nitride in which a concentration of the nitrogen is equal to that of the carbon or is higher than that of the carbon. In an embodiment, the barrier layer 53 may include $C_3N_4$.

The barrier layer 53 may be formed through a deposition process. The deposition process of the barrier layer 53 may be performed in-situ with that of the first electrode 51. The barrier layer 53 may be deposited through a Physical Vapor Deposition (PVD) process. In the deposition, a nitrogen gas having a relatively large amount may be used with relatively low power, thereby forming the barrier layer 53 in an amorphous state. In an embodiment, the barrier layer 53 may be deposited by using a nitrogen gas having an amount of 15 sccm to 30 sccm with power of 50 W to 1000 W. Accordingly, carbon nitride having the amorphous state may be formed.

The barrier layer 53 may be a non-conductor in which current does not flow or hardly flows. Therefore, the barrier layer 53 may be formed to have a relatively small volume or a relatively thin thickness as compared with the first electrode 51 such that current can flow through the barrier layer 53 in a program operation. In an embodiment, the barrier layer 53 (e.g., carbon nitride layer) is formed to have a volume which is 1% to 10% of that of the first electrode 51. In an embodiment, the carbon nitride layer 53 is formed to have a thickness of 1 Å to 10 Å.

Subsequently, a variable resistance layer 54 is formed on the barrier layer 53. Subsequently, a second electrode 52 is formed on the variable resistance layer 54. In an embodiment, the second electrode 52 may include a carbon layer.

According to the manufacturing method described above, the barrier layer 53 can be formed between the first electrode 51 and the variable resistance layer 54. Thus, a read window margin of a memory cell can be ensured. Further, since the barrier layer 53 is formed before the variable resistance layer 54 is formed, the variable resistance layer 54 can be prevented from being nitrified even when the barrier layer 53 is formed by using a relatively large amount of nitrogen gas, thereby preventing a firing voltage from being excessively increased.

The memory circuit or the semiconductor device of the above-described embodiments can be used in various devices or systems. FIGS. 6 to 9 illustrate some examples of a device or system, which can implement the memory circuit or the semiconductor device of the above-described embodiments.

Figure 6:
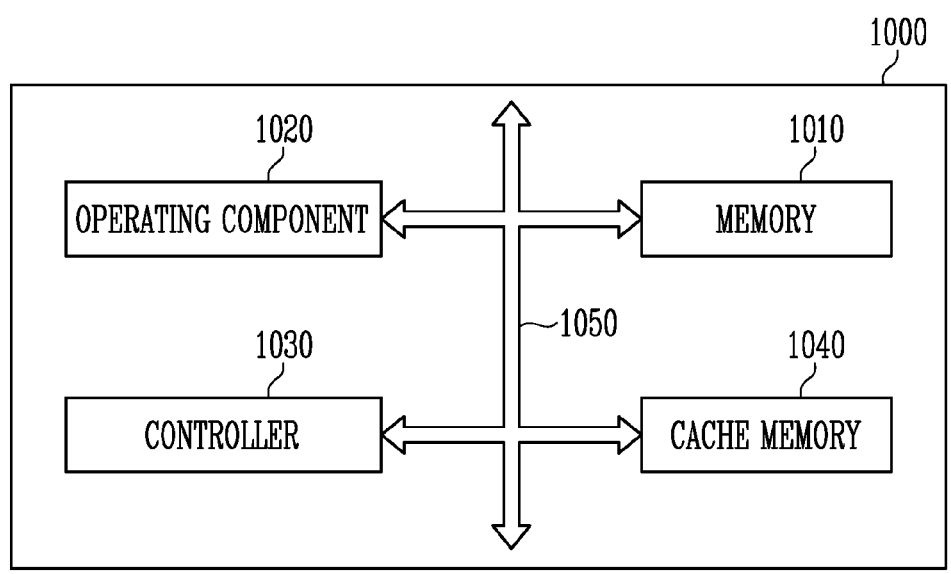
FIG. 6 is an example of a configuration view of a microprocessor implementing a memory device in accordance with an embodiment of the present disclosure.

FIG. 6 is an example of a configuration view of a microprocessor implementing a memory device in accordance with an embodiment of the present disclosure.

Referring to FIG. 6, the microprocessor 1000 may perform tasks for controlling and tuning a series of processes of receiving data from various external devices, processing the data, and outputting processing results to external devices. The microprocessor 1000 may include a memory 1010, an operating component 1020, a controller 1030, and the like. The microprocessor 1000 may be various data processing units such as a central processing unit (CPU), a graphic processing unit (GPU), a digital signal processor (DSP), and an application processor (AP).

The memory 1010 is a part which stores data in the microprocessor 1000, as a processor register, register or the like. The memory 1010 may include various registers such as a data register, an address register, and a floating point register. The memory 1010 may perform the function of temporarily storing data for which operations are to be performed by the operating component 1020, result data of performing the operations and addresses where data for performing of the operations are stored.

The memory 1010 may include one or more of the above-described embodiments of the semiconductor device. For example, the memory 1010 may include at least one memory element, and the memory element may include: a first electrode including a carbon layer; a second electrode; a variable resistance layer interposed between the first electrode and the second electrode; and a barrier layer interposed between the first electrode and the variable resistance layer, the barrier layer including nitrogen and carbon, wherein a concentration of the nitrogen is equal to or higher than that of the carbon. Accordingly, the reliability of the memory 1010 can be enhanced, and a manufacturing process can be improved. Consequently, operation characteristics of the microprocessor 1000 can be improved.

The operating component 1020 may perform several arithmetical operations or logical operations according to results that the controller 1030 decodes commands. The operating component 1020 may include at least one arithmetic logic unit (ALU) and the like.

The controller 1030 may receive signals from the memory 1010, the operating component 1020 and an external device of the microprocessor 1000, perform extraction, decoding of commands, and controlling input and output of signals of the microprocessor 1000, and execute processing represented by programs.

The microprocessor 1000 in accordance with this embodiment may additionally include a cache memory 1040 which can temporarily store data to be inputted from an external device or to be outputted to an external device, other than the memory 1010. The cache memory 1040 may exchange data with the memory 1010, the operating component 1020 and the controller 1030 through a bus interface 1050.

Figure 7:
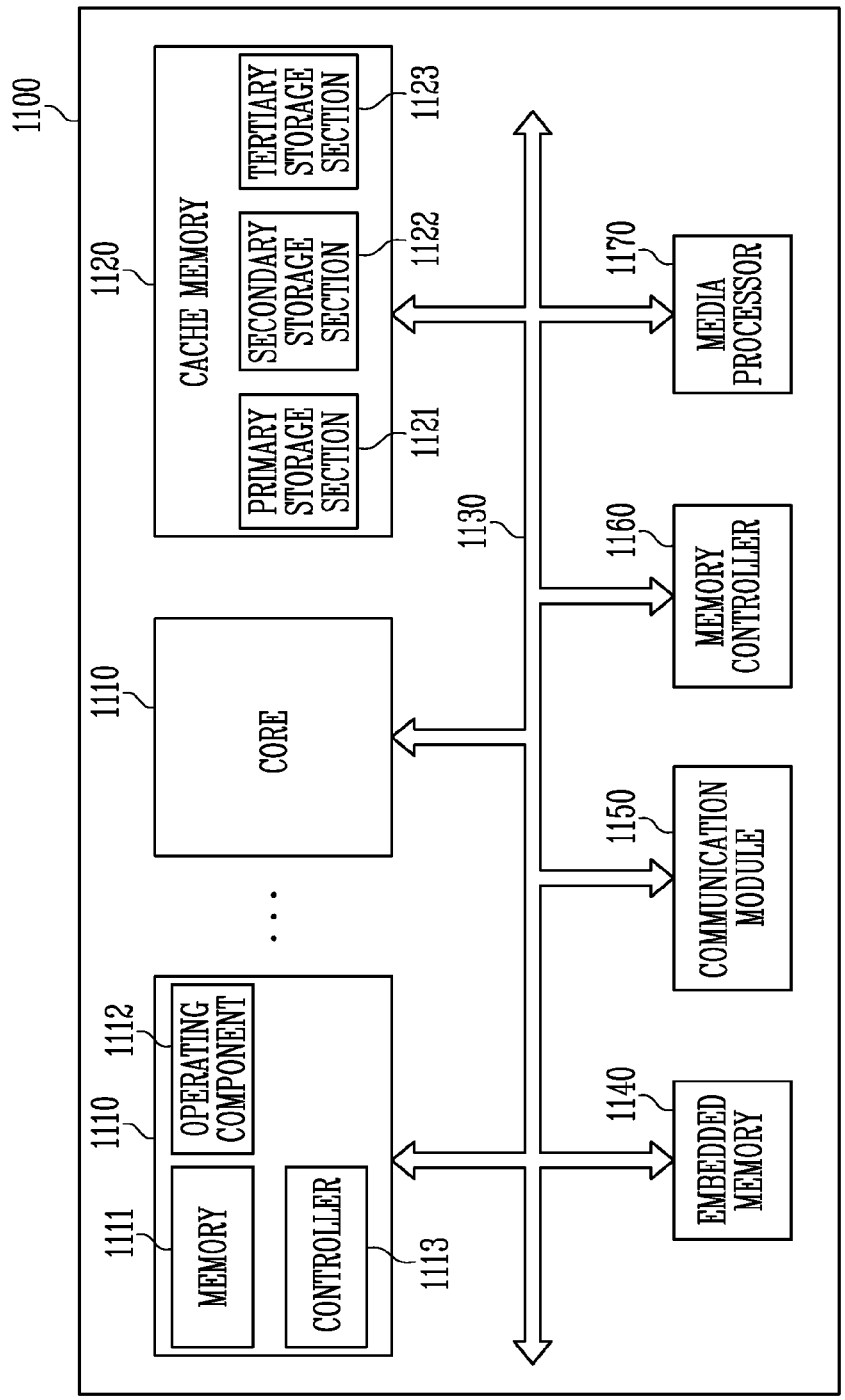
FIG. 7 is an example of a configuration view of a processor implementing a memory device in accordance with an embodiment of the present disclosure.

FIG. 7 is an example of a configuration view of a processor implementing a memory device in accordance with an embodiment of the present disclosure.

Referring to FIG. 7, the processor 1100 may improve performance and realize multi-functionality by including various functions other than those of the above-described microprocessor 1000. The processor 1100 may include a core 1110 which serves as the microprocessor, a cache memory 1120 which serves to storing data temporarily, and a bus interface 1130 for transferring data between internal and external devices. The processor 1100 may include various system-on-chips (SoCs) such as a multi-core processor, a graphic processing unit (GPU), and an application processor (AP).

The core 1110 of this embodiment is a part which performs arithmetic logic operations for data inputted from an external device, and may include a memory 1111, an operating component 1112 and a controller 1113. The memory 1111, the operating component 1112, and the controller 1113 may be substantially identical to the memory 1010, the operating component 1020, and the controller 1030, which are described above.

The cache memory 1120 is a part which temporarily stores data to compensate for a difference in data processing speed between the core 1110 operating at a high speed and an external device operating at a low speed. The cache memory 1120 may include a primary storage section 1121, a secondary storage section 1122, and include a tertiary storage section 1123 in the case where high storage capacity is required. As the occasion demands, the cache memory 1120 may include an increased number of storage sections. That is, the number of storage sections which are included in the cache memory 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory 1120 may include one or more of the above-described embodiments of the memory device. For example, the cache memory 1120 may include at least one memory element, and the memory element may include: a first electrode including a carbon layer; a second electrode; a variable resistance layer interposed between the first electrode and the second electrode; and a barrier layer interposed between the first electrode and the variable resistance layer, the barrier layer including nitrogen and carbon, wherein a concentration of the nitrogen is equal to or higher than that of the carbon. Accordingly, the reliability of the cache memory 1120 can be enhanced, and a manufacturing process can be improved. Consequently, operation characteristics of the processor 1100 can be improved.

Although a case where all the primary, secondary and tertiary storage sections 1121, 1122 and 1123 are configured inside the cache memory 1120 is illustrated in this embodiment, some or all of the primary, secondary and tertiary storage sections 1121, 1122 and 1123 of the cache memory 1120 may be configured inside the core 1110 and may compensate for a difference in data processing speed between the core 1110 and the external device.

The bus interface 1130 is a part which connects the core 1110, the cache memory 1120 and external device and allows data to be efficiently transmitted.

The processor 1100 in accordance with this embodiment may include a plurality of cores 1110, and the plurality of cores 1110 may share the cache memory 1120. The plurality of cores 1110 and the cache memory 1120 may be directly connected or be connected through the bus interface 1130. The plurality of cores 1110 may be configured in the same way as the above-described configuration of the core 1110. The storage section in each of the plurality of cores 1110 may be configured outside the core 1110 in such a way as to be shared through the bus interface 1130.

The processor 1100 in accordance with this embodiment may further include an embedded memory 1140 which stores data, a communication module 1150 which can transmit and receive data to and from an external device in a wired or wireless manner, a memory controller 1160 which drives an external memory device, and a media processor 1170 which processes the data processed in the processor 1100 or the data inputted from an external input device and outputs the processed data to an external interface device, and the like. Besides, the processor 1100 may include a plurality of various modules and devices. The plurality of modules which are added may exchange data with the cores 1110 and the cache memory 1120 and with one another, through the bus interface 1130.

The embedded memory 1140 may include not only a volatile memory but also a nonvolatile memory. The volatile memory may include a DRAM (dynamic random access memory), a mobile DRAM, an SRAM (static random access memory), and a memory with similar functions to above mentioned memories, and the like. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and the like.

The memory controller 1160 is to administrate and process data transmitted between the processor 1100 and an external storage device operating according to a different communication standard. The memory controller 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processor 1170 may process the data processed in the processor 1100 or the data inputted in the forms of image, voice and others from the external input device and output the data to the external interface device. The media processor 1170 may include a graphic processing unit (GPU), a digital signal processor (DSP), a high definition audio device (HD audio), a high definition multimedia interface (HDMI) controller, and the like.

Figure 8:
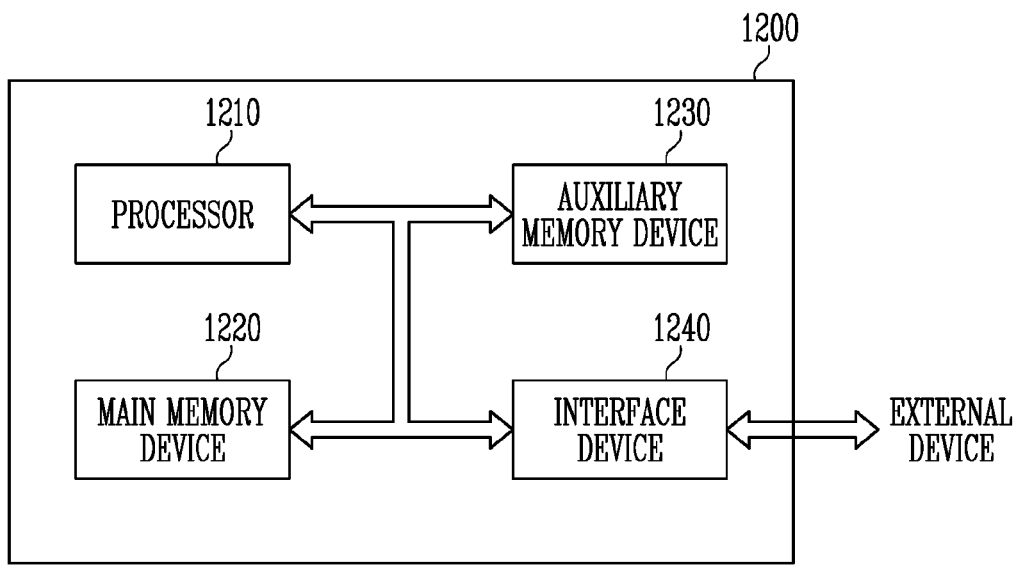
FIG. 8 is an example of a configuration view of a system implementing a memory device in accordance with an embodiment of the present disclosure.

FIG. 8 is an example of a configuration view of a system implementing a memory device in accordance with an embodiment of the present disclosure.

Referring to FIG. 8, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and the like. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and the like.

The processor 1210 may decode inputted commands and processes operation, comparison, etc. for the data stored in the system 1200, and controls these operations. The processor 1210 may be substantially identical to the above-described microprocessor 1000 or the above-described processor 1100.

The main memory device 1220 is a storage which can temporarily store, call and execute program codes or data from the auxiliary memory device 1230 when programs are executed and can conserve memorized contents even when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The main memory device 1220 or the auxiliary memory device 1230 may include one or more of the above-described embodiments of the semiconductor device. For example, the main memory device 1220 or the auxiliary memory device 1230 may include at least one memory element, and the memory element may include: a first electrode including a carbon layer; a second electrode; a variable resistance layer interposed between the first electrode and the second electrode; and a barrier layer interposed between the first electrode and the variable resistance layer, the barrier layer including nitrogen and carbon, wherein a concentration of the nitrogen is equal to or higher than that of the carbon. Accordingly, the reliability of the main memory device 1220 or the auxiliary memory device 1230 can be enhanced, and a manufacturing process can be improved. Consequently, operation characteristics of the system 1200 can be improved.

Figure 9:
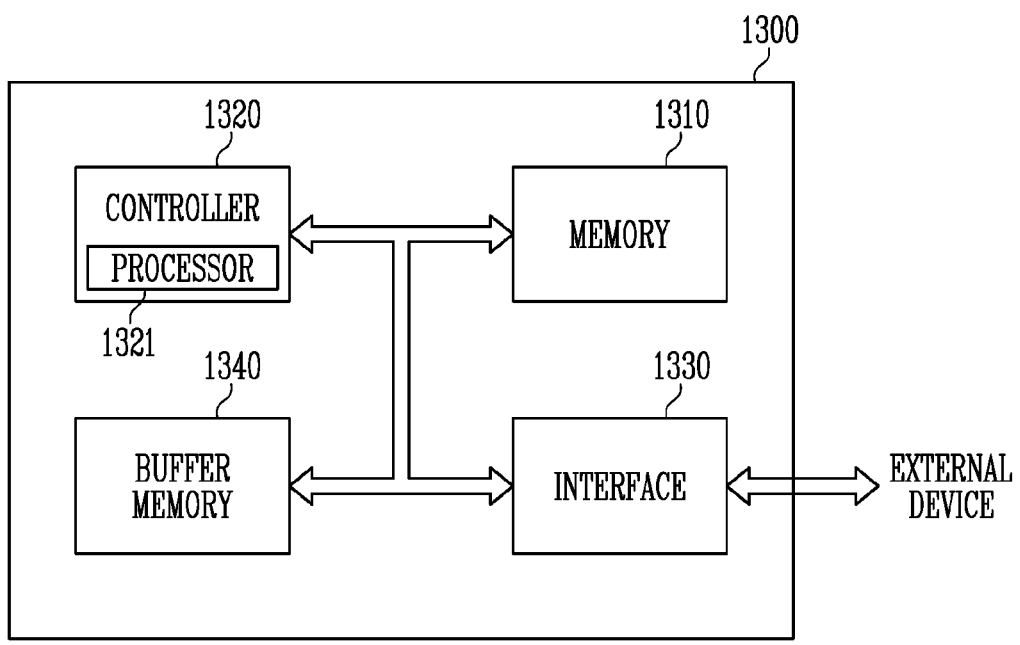
FIG. 9 is an example of a configuration view of a memory system implementing a memory device in accordance with an embodiment of the present disclosure.

The main memory device 1220 or the auxiliary memory device 1230 may include a memory system 1300 as shown in FIG. 9, in addition to the semiconductor memory of the above-described embodiment or without including the semiconductor memory of the above-described embodiment.

The interface device 1240 may be to perform exchange of commands and data between the system 1200 of this embodiment and an external device. The interface device 1240 may be a keypad, a keyboard, a mouse, a speaker, a mike, a display, various human interface devices (HIDs), a communication device, and the like. The communication device may be substantially identical to the above-described communication module 1150.

FIG. 9 is an example of a configuration view of a memory system implementing a memory device in accordance with an embodiment of the present disclosure.

Referring to FIG. 9, the memory system 1300 may include a memory 1310 which has a nonvolatile characteristic as a component for storing data, a controller 1320 which controls the memory 1310, an interface 1330 for connection with an external device, and a buffer memory 1340 which temporarily stores data so as to efficiently transfer an input/output of data between the interface 1330 and the memory 1310. The memory system 1300 may mean a memory which simply stores data. Further, the memory system 1300 may mean a data storage device which conserves stored data in the long term. The memory system 1300 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory 1310 or the buffer memory 1340 may include one or more of the above-described embodiments of the semiconductor device. For example, the memory 1310 or the buffer memory 1340 may include at least one memory element, and the memory element may include: a first electrode including a carbon layer; a second electrode; a variable resistance layer interposed between the first electrode and the second electrode; and a barrier layer interposed between the first electrode and the variable resistance layer, the barrier layer including nitrogen and carbon, wherein a concentration of the nitrogen is equal to or higher than that of the carbon. Accordingly, the reliability of the memory 1310 or the buffer memory 1340 can be enhanced, and a manufacturing process can be improved. Consequently, operation characteristics of the memory system 1300 can be improved.

The memory 1310 or the buffer memory 1340 may include various volatile or nonvolatile memories, in addition to the semiconductor memory of the above-described embodiment or without including the semiconductor memory of the above-described embodiment.

The controller 1320 may control exchange of data between the memory 1310 and the interface 1330. To this end, the controller 1320 may include a processor 1321 for performing an operation of processing commands inputted through the interface 1330 from an outside of the memory system 1300.

The interface 1330 is to perform exchange of commands and data between the memory system 1300 and the external device. When the memory system 1300 is of a card type or a disk type, the interface 1330 may be compatible with interfaces which are used in the card-type or disk-type devices, or be compatible with interfaces which are used in devices similar to the above mentioned devices. The interface 130 may be compatible with one or more interfaces having a different type from each other.

In accordance with embodiments of the present disclosure, the degree of integration of the semiconductor device can be improved. Further, the semiconductor device can have a stable structure and improved reliability.

Some embodiments have been described in the drawings and specification of the present disclosure. Although specific terminologies are used here, those are only to explain the embodiments of the present disclosure. Therefore, embodiments of the present disclosure are not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A semiconductor device comprising:
   a first electrode including a carbon layer;
   a second electrode;
   a variable resistance layer interposed between the first electrode and the second electrode; and
   a barrier layer interposed between the first electrode and the variable resistance layer, the barrier layer including nitrogen and carbon,
   wherein the barrier layer is in direct physical contact with the variable resistance layer, and
   wherein a concentration of the nitrogen in the barrier layer is equal to or higher than that of the carbon in the barrier layer.

2. The semiconductor device of claim 1, wherein the barrier layer is in an amorphous state.

3. The semiconductor device of claim 1, wherein the barrier layer is a non-conductor.

4. The semiconductor device of claim 1, wherein a volume of the barrier layer is 1% to 10% of that of the first electrode.

5. The semiconductor device of claim 1, wherein the variable resistance layer maintains an amorphous state in a program operation.

6. A semiconductor device comprising:
   a first electrode including a first element;
   a second electrode;
   a variable resistance layer interposed between the first electrode and the second electrode; and
   a barrier layer interposed between the first electrode and the variable resistance layer, the barrier layer including the first element and a second element,
   wherein the barrier layer is in direct physical contact with the variable resistance layer, and
   wherein a concentration of the second element in the barrier layer is equal to or higher than that of the first element in the barrier layer, and the barrier layer is in an amorphous state.

7. The semiconductor device of claim 6, wherein the first element is carbon, and the second element is nitrogen.

8. The semiconductor device of claim 6, wherein a volume of the barrier layer is 1% to 10% of that of the first electrode.

9. The semiconductor device of claim 6, wherein a thickness of the barrier layer is 1 Å to 10 Å.

* * * * *